United States Patent
Takahashi et al.

(10) Patent No.: US 10,132,001 B2
(45) Date of Patent: Nov. 20, 2018

(54) VAPOR PHASE GROWTH APPARATUS AND VAPOR PHASE GROWTH METHOD

(71) Applicant: NuFlare Technology, Inc., Kanagawa (JP)

(72) Inventors: Hideshi Takahashi, Kanagawa (JP); Shinichi Mitani, Kanagawa (JP); Yuusuke Sato, Tokyo (JP)

(73) Assignee: NuFlare Technology, Inc., Kanagawa (JP)

( * ) Notice: Subject to any disclaimer, the term of this patent is extended or adjusted under 35 U.S.C. 154(b) by 14 days.

(21) Appl. No.: 14/810,575

(22) Filed: Jul. 28, 2015

(65) Prior Publication Data

US 2016/0032488 A1 Feb. 4, 2016

(30) Foreign Application Priority Data

Jul. 31, 2014 (JP) .................................. 2014-156999

(51) Int. Cl.
*C23C 16/455* (2006.01)
*C30B 29/40* (2006.01)
*C30B 25/14* (2006.01)

(52) U.S. Cl.
CPC ...... *C30B 29/406* (2013.01); *C23C 16/45561* (2013.01); *C30B 25/14* (2013.01)

(58) Field of Classification Search
CPC combination set(s) only.
See application file for complete search history.

(56) References Cited

U.S. PATENT DOCUMENTS 5,873,942 A * 2/1999 Park ........................ C23C 16/52
 118/715
6,001,420 A * 12/1999 Mosely ............. H01L 21/76843
 257/E21.585

(Continued)

FOREIGN PATENT DOCUMENTS

CN 102534713 A 7/2012
JP 10-158843 6/1998

(Continued)

OTHER PUBLICATIONS

Korean Office Action dated Jan. 19, 2017 issued in the corresponding Korean patent application No. 10-2015-0108446 and its English translation.

(Continued)

*Primary Examiner* — Erin F Bergner
(74) *Attorney, Agent, or Firm* — Rankin, Hill & Clark LLP

(57) ABSTRACT

A vapor phase growth apparatus according to an embodiment includes n reaction chambers, a main gas supply passage supplying a process gas to the n reaction chambers, a main mass flow controller arranged in the main gas supply passage to control a flow rate of the process gas flowing in the main gas supply passage, (n−1) first sub gas supply passages being branches of the main gas supply passage to supply divided process gases to the (n−1) reaction chambers among the n reaction chambers, (n−1) first sub mass flow controllers arranged in the first sub gas supply passages to control flow rates of the process gases flowing in the first sub gas supply passages, and one second sub gas supply passage being a branch of the main gas supply passage to supply a remainder of the process gas to the one reaction chamber other than the (n−1) reaction chambers.

14 Claims, 4 Drawing Sheets

(56) References Cited

U.S. PATENT DOCUMENTS

| | | |
|---|---|---|
| 2002/0038669 A1 | 4/2002 | Yamagishi |
| 2006/0217900 A1* | 9/2006 | Shajii ................. G01F 25/0038 |
| | | 702/45 |
| 2011/0265549 A1* | 11/2011 | Cruse ................ H01L 21/67253 |
| | | 73/1.16 |

FOREIGN PATENT DOCUMENTS

| | | |
|---|---|---|
| JP | 2002110570 A2 | 4/2002 |
| JP | 2002-212735 | 7/2002 |
| JP | 2002313731 A2 | 10/2002 |
| KR | 20080025575 | 3/2008 |

OTHER PUBLICATIONS

Korean Office Action dated Jul. 28, 2017 issued in the corresponding Korean patent application No. 10-2015-0108446 and its English translation.

Korean Office Action dated Sep. 25, 2017 issued in the corresponding Korean Patent application No. 10-2015-0108446 and its English translation.

Japanese Office Action dated Mar. 27, 2018 issued in the corresponding Japanese patent application No. 2014-156999 and its English translation.

\* cited by examiner

VAPOR PHASE GROWTH APPARATUS AND VAPOR PHASE GROWTH METHOD

CROSS-REFERENCE TO RELATED APPLICATION

This application is based upon and claims the benefit of priority from Japanese Patent Applications No. 2014-156999, filed on Jul. 31, 2014, the entire contents of which are incorporated herein by reference.

FIELD OF THE INVENTION

The present invention relates to a vapor phase growth apparatus and a vapor phase growth method of performing film formation by supplying gases.

BACKGROUND OF THE INVENTION

As one of a method of forming a high quality semiconductor film, there is an epitaxial growth technique of forming a single crystal film on a substrate such as a wafer by vapor phase growth. In a vapor phase growth apparatus using the epitaxial growth technique, a wafer is mounted on a support unit in a reaction chamber which is maintained in a normal pressure or a reduced pressure. Next, while heating the wafer, a process gas such as a source gas which is a raw material for film formation is supplied from, for example, a shower plate in an upper portion of the reaction chamber to a surface of the wafer. Thermal reaction of the source gas occurs on the surface of the wafer, so that a single crystal epitaxial film is formed on the surface of the wafer.

In recent years, as a material for a light emitting device or a power device, a GaN (gallium nitride)-based semiconductor device has attracted attention. As an epitaxial growth technique of forming a GaN-based semiconductor film, there is an organic metal vapor phase growth method (MOCVD method). In the organic metal vapor phase growth method, for example, organic metal such as trimethyl gallium (TMG), trimethyl indium (TMI), and trimethyl aluminum (TMA) or ammonia ($NH_3$) or the like is used as a source gas.

JP-A H10-158843 and JP-A 2002-212735 disclose vapor phase growth apparatuses including a plurality of reaction chambers for improving productivity.

SUMMARY OF THE INVENTION

A vapor phase growth apparatus according to an aspect of the invention includes n (n is an integer of 2 or more) reaction chambers, a main gas supply passage supplying a process gas to the n reaction chambers, a main mass flow controller arranged in the main gas supply passage, the main mass flow controller controlling a flow rate of the process gas flowing in the main gas supply passage, (n−1) first sub gas supply passages being branches of the main gas supply passage, the first sub gas supply passages supplying divided process gases to (n−1) reaction chambers among the n reaction chambers respectively, (n−1) first sub mass flow controllers arranged in the first sub gas supply passages respectively, the first sub mass flow controllers controlling flow rates of the divided process gases respectively, and one second sub gas supply passage being a branch of the main gas supply passage, the second sub gas supply passage supplying a remainder of the process gas that is not flowing in the first sub gas supply passages, to one reaction chamber other than the (n−1) reaction chambers.

A vapor phase growth method according to another aspect of the invention includes loading a substrate into each of n reaction chambers, allowing a process gas having a flow rate controlled by a main mass flow controller to flow in a main gas supply passage, allowing the process gases having flow rates controlled by sub mass flow controllers to flow in (n−1) sub gas supply passages being branches of the main gas supply passage, allowing a remainder of the process gas not flowing in the (n−1) sub gas supply passages to flow in one sub gas supply passage being a branch of the main gas supply passage, and supplying the process gases from the (n−1) sub gas supply passages and the one sub gas supply passage to the respective n reaction chambers to perform film formation on each of the substrates.

DETAILED DESCRIPTION OF THE EMBODIMENTS

Figure 1:
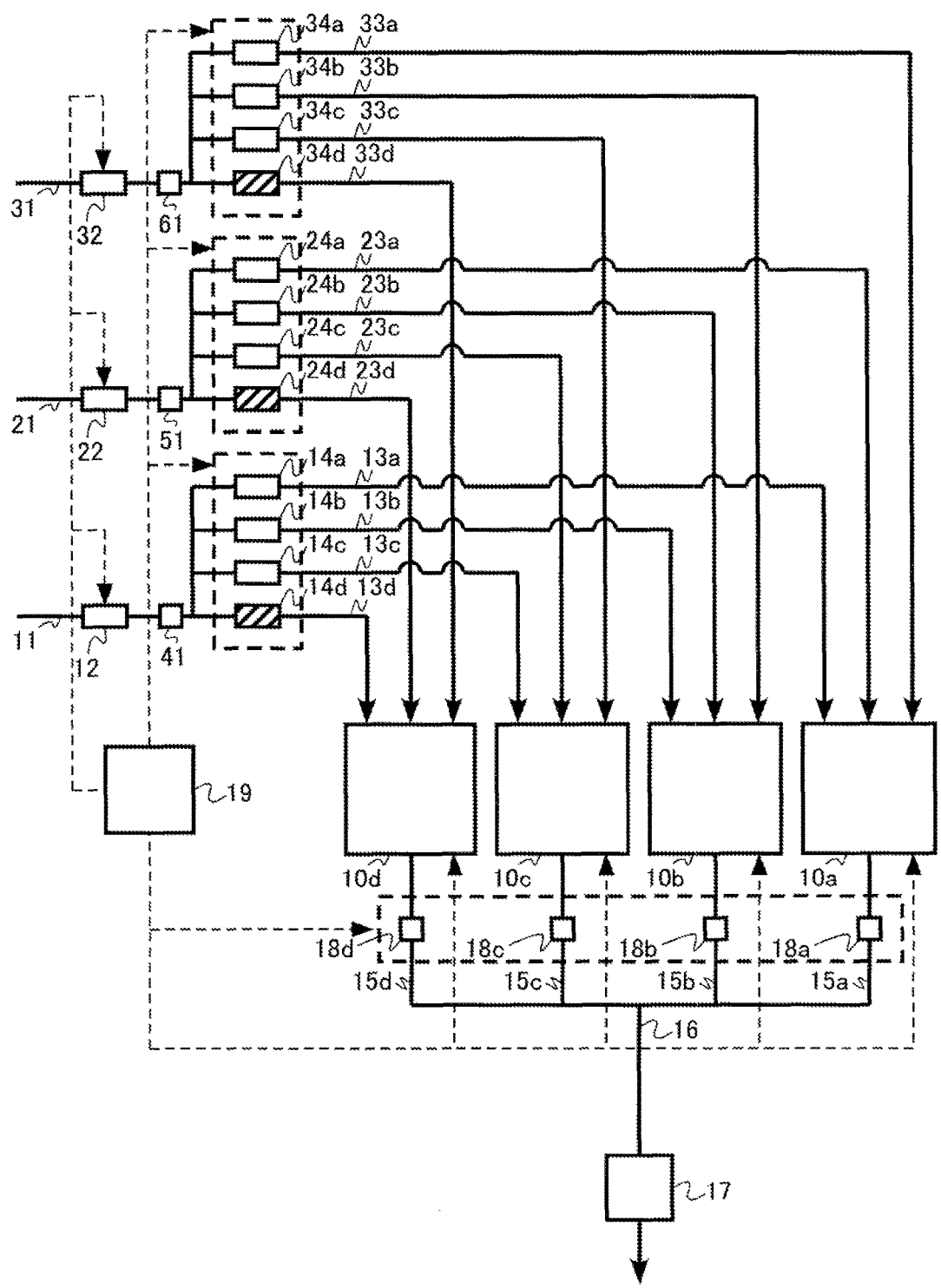
FIG. 1 is a configuration view illustrating a vapor phase growth apparatus according to a first embodiment.

Hereinafter, embodiments of the invention will be described with reference to the drawings.

In addition, in this specification, in the state where a vapor phase growth apparatus is installed so as to enable film formation, the direction of gravity is defined as a "down" direction, and the opposite direction thereof is defined as an "up" direction. Therefore, the term "lower portion" denotes a position in the direction of gravity with respect to the reference, and the term "under" denotes the direction of gravity with respect to the reference. In addition, the term "upper portion" denotes a position in the opposite direction of the direction of gravity with respect to the reference, and the term "above" denotes the opposite direction of the direction of gravity with respect to the reference. In addition, the term "vertical direction" denotes the direction of gravity.

In addition, in this specification, a "process gas" is a general term for gases used for forming films on a substrate and includes, for example, a source gas, a carrier gas, a separation gas, and the like conceptively.

In addition, in this specification, the "separation gas" is a process gas which is introduced into a reaction chamber of a vapor phase growth apparatus and is a general term for gases separating plural source gases.

First Embodiment

A vapor phase growth apparatus according to this embodiment includes n (n is an integer of 2 or more) reaction chambers, a main gas supply passage supplying a process gas to the n reaction chambers, a main mass flow controller arranged in the main gas supply passage, the main mass flow controller controlling a flow rate of the process gas flowing in the main gas supply passage, (n−1) first sub gas supply passages being branches of the main gas supply passage, the first sub gas supply passages supplying divided process gases to (n−1) reaction chambers among the n reaction chambers respectively, (n−1) first sub mass flow controllers arranged in the first sub gas supply passages respectively, the first sub mass flow controllers controlling flow rates of the divided process gases respectively, and one second sub gas supply passage being a branch of the main gas supply passage, the second sub gas supply passage supplying a remainder of the process gas that is not flowing in the first sub gas supply passages, to one reaction chamber other than the (n–1) reaction chambers.

In addition, a vapor phase growth method according to this embodiment includes loading n substrates into n reaction chambers respectively, allowing a process gas having a flow rate controlled by a main mass flow controller to flow in a main gas supply passage, allowing the process gases having flow rates controlled by sub mass flow controllers to flow in (n–1) first sub gas supply passages being branches of the main gas supply passage, allowing a remainder of the process gas that is not flowing in the (n–1) first sub gas supply passages to flow, in one second sub gas supply passage being a branch of the main gas supply passage, and supplying the process gases from the first sub gas supply passages and the second sub gas supply passage to the respective n reaction chambers to perform film formation on each of the substrates.

The vapor phase growth apparatus and the vapor phase growth method according to this embodiment have the above-described configurations, so that it is possible to prevent excessive pressure from being exerted on pipes and the like when the process gas is distributed and supplied to a plurality of the reaction chambers. Accordingly, it is possible to achieve the highly reliable vapor phase growth apparatus and vapor phase growth method.

FIG. 1 is a configuration view illustrating a vapor phase growth apparatus according to this embodiment. The vapor phase growth apparatus according to this embodiment is an epitaxial growth apparatus using an MOCVD method (organic metal vapor phase growth method). Hereinafter, the case of epitaxially growing GaN (gallium nitride) will be mainly described as an example.

The vapor phase growth apparatus according to this embodiment includes four reaction chambers 10a, 10b, 10c, and 10d. Each of the four reaction chambers 10a to 10d is, for example, a vertical single-wafer type epitaxial growth apparatus. The number of reaction chambers is not limited to four, but any arbitrary number of two or more is available. The number of reaction chambers may be denoted by n (n is an integer of 2 or more).

The vapor phase growth apparatus according to this embodiment includes three main gas supply passages of a first main gas supply passage 11, a second main gas supply passage 21, and third main gas supply passage 31 which supply process gases to the four reaction chambers 10a to 10d.

The first main gas supply passage 11 supplies a first process gas containing, for example, an organic metal of a group III element and a carrier gas to the reaction chambers 10a to 10d. The first process gas is a gas containing group III elements at the time of forming a group III-V semiconductor film on a wafer.

The group III element is, for example, gallium (Ga), aluminum (Al), indium (In), or the like. In addition, the organic metal is trimethyl gallium (TMG), trimethyl aluminum (TMA), trimethyl indium (TMI), or the like.

The carrier gas is, for example, a hydrogen gas. Only the hydrogen gas may be allowed to flow in the first main gas supply passage 11.

A first main mass flow controller 12 is arranged in the first main gas supply passage 11. The first main mass flow controller 12 controls a flow rate of the first process gas flowing in the first main gas supply passage 11.

In addition, the first main gas supply passage 11 is branched into four sub gas supply passages of three first sub gas supply passages 13a, 13b13c, and one second sub gas supply passage 13d so as to be closer to the sides of the reaction chambers 10a to 10d than the first main mass flow controller 12. The first sub gas supply passages 13a, 13b, 13c, and the second sub gas supply passage 13d supply the divided first process gases to the four reaction chambers 10a, 10b, 10c, and 10d, respectively.

A pressure gauge 41 is arranged in the first main gas supply passage 11. The pressure gauge 41 is arranged between the first main mass flow controller 12 and the branching point of the four sub gas supply passages of the first sub gas supply passages 13a, 13b, 13c, and the second sub gas supply passage 13d. The pressure gauge 41 monitors a pressure of the first main gas supply passage 11.

Among the four sub gas supply passages 13a to 13d, three sub gas supply passages, for example, the first sub gas supply passages 13a to 13c are provided with three first sub mass flow controllers 14a, 14b, and 14c, respectively. The first sub mass flow controllers 14a to 14c control flow rates of the first process gases flowing in the first sub gas supply passages 13a to 13c, respectively. The first sub mass flow controllers 14a to 14c are flow rate control type mass flow controllers.

Among the four sub gas supply passages 13a to 13d, the remaining one sub gas supply passage, that is, the second sub gas supply passage 13d is provided with an opening degree control type second sub mass flow controller 14d. The second sub gas supply passage 13d supplies the first process gas to the one reaction chamber 10d other than the three reaction chambers 10a, 10b, and 10c to which the first sub gas supply passages 13a to 13c supply the first process gases. The flow rate of the remainder which does not flow in the first sub gas supply passages 13a to 13c among the total flow rate of the first process gas supplied from the first main gas supply passage 11 is supplied from the second sub gas supply passage 13d to the reaction chamber 10d.

More specifically, the opening degree of the second sub mass flow controller 14d is controlled based on a measurement result of the pressure of the first main gas supply passage 11 monitored by the pressure gauge 41. For example, a configuration where the pressure is controlled so as to be zero is provided. According to the configuration, the flow rate of the remainder which does not flow in the first gas supply passages 13a to 13c among the total flow rate of the first process gas supplied from the first main gas supply passage 11 can be supplied from the second sub gas supply passage 13d to the reaction chamber 10d.

The second main gas supply passage 21 supplies a second process gas containing, for example, ammonia ($NH_3$) to the reaction chambers 10a to 10d. The second process gas is a source gas of a group V element, nitrogen (N) at the time of forming a group III-V semiconductor film on the wafer.

Only the hydrogen gas may be allowed to flow in the second main gas supply passage 21.

A second main mass flow controller 22 is arranged in the second main gas supply passage 21. The second main mass flow controller 22 controls a flow rate of the second process gas flowing in the second main gas supply passage 21.

In addition, the second main gas supply passage 21 is branched into four sub gas supply passages of first sub gas supply passages 23a, 23b, 23c, and a second sub gas supply passage 23d so as to be closer to the sides of the reaction chambers 10a to 10d than the second main mass flow controller 22. The first sub gas supply passages 23a, 23b, 23c, and the second sub gas supply passage 23d supply the divided second process gases to the four reaction chambers 10a, 10b, 10c, and 10d, respectively.

A pressure gauge 51 is arranged in the second main gas supply passage 21. The pressure gauge 51 is arranged between the second main mass flow controller 22 and the branching point of the four sub gas supply passages of the first sub gas supply passages 23a, 23b, 23c, and the second sub gas supply passage 23d. The pressure gauge 51 monitors a pressure of the second main gas supply passage 21.

Among the four sub gas supply passages 23a to 23d, three sub gas supply passages, for example, the first gas supply passages 23a to 23c are provided with first sub mass flow controllers 24a, 24b, and 24c, respectively. The first sub mass flow controllers 24a to 24c control flow rates of the second process gases flowing in the first sub gas supply passages 23a to 23c. The first sub mass flow controllers 24a to 24c are flow rate control type mass flow controllers.

Among the four sub gas supply passages 23a to 23d, the remaining one sub gas supply passage, that is, the second sub gas supply passage 23d is provided with an opening degree control type second sub mass flow controller 24d. The second sub gas supply passage 23d supplies the second process gas to the one reaction chamber 10d other than the three reaction chambers 10a, 10b, and 10c to which the first gas supply passages 23a to 23c supply the second process gases. The flow rate of the remainder which does not flow in the first gas supply passages 23a to 23c among the total flow rate of the second process gas supplied from the second main gas supply passage 21 is supplied from the second sub gas supply passage 23d to the reaction chamber 10d.

More specifically, the opening degree of the second sub mass flow controller 24d is controlled based on a measurement result of the pressure of the second main gas supply passage 21 monitored by the pressure gauge 51. For example, a configuration where the pressure is controlled so as to be zero is provided. According to the configuration, the flow rate of the remainder which does not flow in the first gas supply passages 23a to 23c among the total flow rate of the second process gas supplied from the second main gas supply passage 21 can be supplied from the second sub gas supply passage 23d to the reaction chamber 10d.

The third main gas supply passage 31 supplies a third process gas. The third process gas is a so-called separation gas and is allowed to be ejected between both of the gases at the time of ejecting the first process gas and the second process gas into the reaction chamber 10. As a result, the reaction of the first process gas and the second process gas immediately after the ejection is suppressed. The third process gas is, for example, a hydrogen gas.

A third main mass flow controller 32 is arranged in the third main gas supply passage 31. The third main mass flow controller 32 controls a flow rate of the third process gas flowing in the third main gas supply passage 31.

In addition, the third main gas supply passage 31 is branched into four sub gas supply passages of first sub gas supply passages 33a, 33b, 33c, and a second sub gas supply passage 33d so as to be closer to the sides of the reaction chambers 10a to 10d than the third main mass flow controller 32. The first sub gas supply passages 33a, 33b, 33c, and the second sub gas supply passage 33d supply the divided third process gases to the four reaction chambers 10a, 10b, 10c, and 10d, respectively.

A pressure gauge 61 is arranged in the third main gas supply passage 31. The pressure gauge 61 is arranged between the third main mass flow controller 32 and the branching point of the four sub gas supply passages of the first sub gas supply passage 33a, the second sub gas supply passage 33b, the third sub gas supply passage 33c, and the second sub gas supply passage 33d. The pressure gauge 61 monitors a pressure of the third main gas supply passage 31.

Among the four sub gas supply passages 33a to 33d, three sub gas supply passages, for example, the first sub gas supply passages 33a to 33c are provided with a first sub mass flow controllers 34a, 34b, 34c. The sub mass flow controllers 34a to 34c control flow rates of the third process gases flowing in the first supply passages 33a to 33c. The first sub mass flow controllers 34a to 34c are flow rate control type mass flow controllers.

Among the four sub gas supply passages 33a to 33d, the remaining one sub gas supply passage, that is, the second sub gas supply passage 33d is provided with an opening degree control type second sub mass flow controller 34d. The second sub gas supply passage 33d supplies the third process gas to the one reaction chamber 10d other than the three reaction chambers 10a, 10b, and 10c to which the first sub gas supply passages 33a to 33c supply the third process gases. The flow rate of the remainder which does not flow in the first sub gas supply passages 33a to 33c among the total flow rate of the third process gas supplied from the third main gas supply passage 31 is supplied from the second sub gas supply passage 33d to the reaction chamber 10d.

More specifically, the opening degree of the second sub mass flow controller 34d is controlled based on a measurement result of the pressure of the third main gas supply passage 31 monitored by the pressure gauge 61. For example, a configuration where the pressure is controlled so as to be zero is provided. According to the configuration, the flow rate of the remainder which does not flow in the first sub gas supply passages 33a to 33c among the total flow rate of the third process gas supplied from the third main gas supply passage 31 can be supplied from the second sub gas supply passage 33d to the reaction chamber 10d.

The vapor phase growth apparatus according to this embodiment includes four sub gas exhaust passage 15a, 15b, 15c, and 15d which exhaust gases from the four reaction chambers 10a, 10b, 10c, and 10d, respectively. In addition, the vapor phase growth apparatus includes a main gas exhaust passage 16 which is a confluence of the four sub gas exhaust passages 15a, 15b, 15c, and 15d. In addition, a vacuum pump 17 for sucking a gas is arranged in the main gas exhaust passage 16. The vacuum pump 17 is an example of a pump.

The four sub gas exhaust passages 15a, 15b, 15c, and 15d are provided with pressure adjusting units 18a, 18b, 18c, and 18d, respectively. The pressure adjusting units 18a, 18b, 18c, and 18d controls internal pressures of the reaction chambers 10a to 10d to be desired values, respectively. The pressure adjusting units 18a to 18d are, for example, pressure adjusting valves such as throttle valves.

In addition, the vapor phase growth apparatus according to this embodiment includes a control unit 19 which is capable of simultaneously controlling the vapor phase growth conditions of the four reaction chambers 10a, 10b, 10c, and 10d to be substantially the same condition, that is, substantially the same process recipe. The control unit 19 is, for example, a control circuit. The control circuit is configured, for example, as hardware or a combination of hardware and software.

Figure 2:
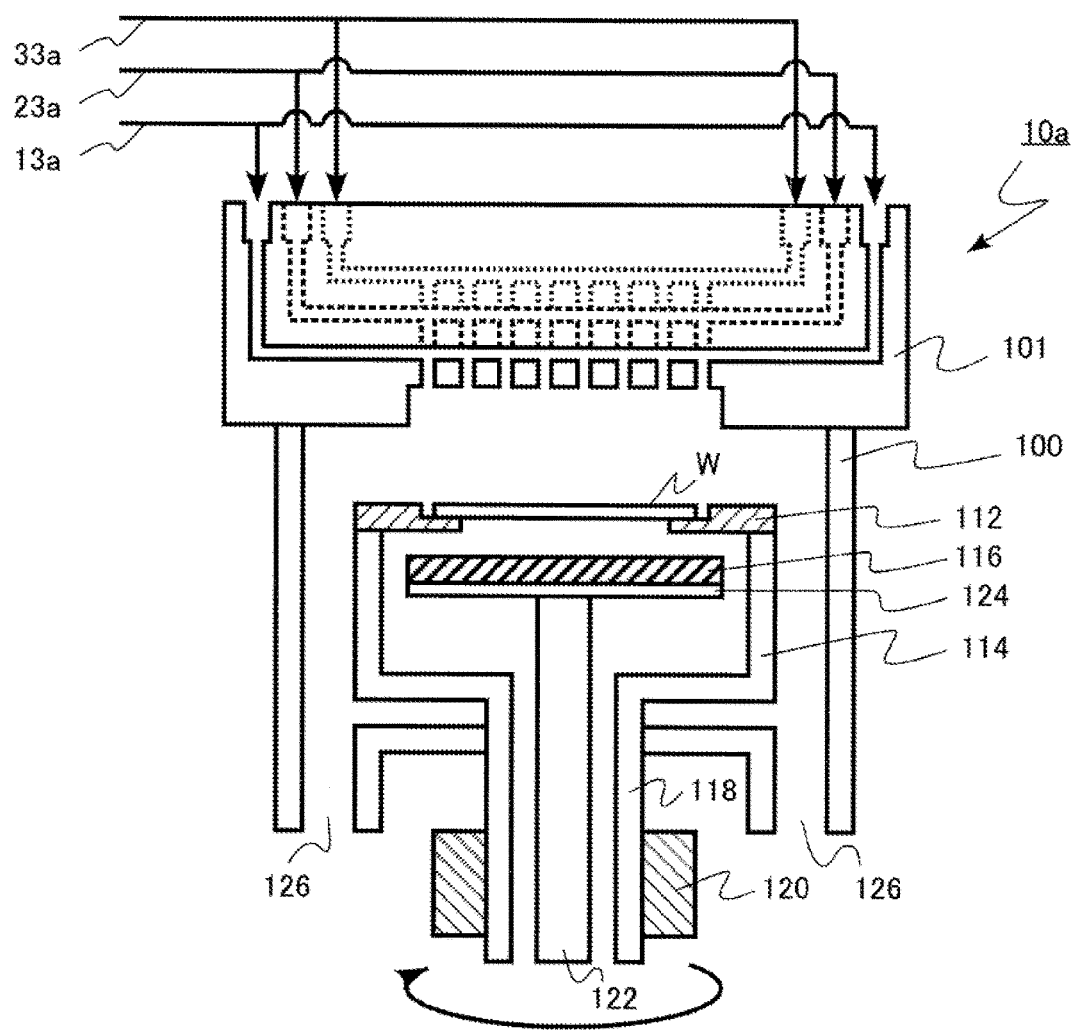
FIG. 2 is a cross-sectional view schematically illustrating a reaction chamber of the vapor phase growth apparatus according to the first embodiment.

FIG. 2 is cross-sectional view schematically illustrating the reaction chamber of the vapor phase growth apparatus according to this embodiment. One of the four reaction chambers 10a to 10d, for example, the reaction chamber 10a is illustrated. In addition, all of the four reaction chambers 10a to 10d have substantially the same configuration.

As illustrated in FIG. 2, the reaction chamber 10a according to this embodiment includes a wall 100 of a cylindrical hollow body made of, for example, stainless steel. In addition, the reaction chamber includes a shower plate 101 which is arranged in an upper portion of the reaction chamber 10a to supply a process gas into the reaction chamber 10a.

In addition, the reaction chamber includes a support unit 112 which is arranged under the shower plate 101 in the reaction chamber 10a and on which a semiconductor wafer (substrate) W can be mounted. The support unit 112 is, for example, an annular holder where an opening portion is arranged in the central portion or a susceptor having a structure which is in contact with almost the entire rear surface of the semiconductor wafer W.

The three first sub gas supply passages 13a, 23a, and 33a are connected to the shower plate 101. A plurality of gas ejection holes for ejecting the first, second, and third process gases supplied from the first sub gas supply passages 13a, 23a, and 33a into the reaction chamber 10a are arranged at the side of the reaction chamber 10a of the shower plate 101.

In addition, a rotating body unit 114 which rotates in a state where the support unit 112 is disposed on the upper surface thereof and a heater as a heating unit 116 of heating the wafer W mounted on the support unit 112 are arranged under the support unit 112. Herein, a rotating shaft 118 of the rotating body unit 114 is connected to a rotation driving mechanism 120 which is disposed under the rotating body unit. Therefore, by the rotation driving mechanism 120, the semiconductor wafer W can be rotated, for example, at a rotational speed of 50 rpm or more and 3000 rpm or less by using the center of the semiconductor wafer as a rotational center.

It is preferable that a diameter of the cylindrical rotating body unit 114 be substantially the same as an outer circumferential diameter of the support unit 112. In addition, the rotating shaft 118 is rotatably arranged at the bottom portion of the reaction chamber 10a through a vacuum seal member.

The heating unit 116 is fixedly arranged on a support base 124 which is fixed to a support shaft 122 penetrating through an inner portion of the rotating shaft 118. The heating unit 116 is supplied with electric power through a current input terminal (not shown) and an electrode (not shown). For example, a push up pin (not shown) for detaching the semiconductor wafer W from the annular holder is arranged in the support base 124.

In addition, a gas exhaust portion 126 which exhausts reaction products after the reaction of the source gas on the surface of the semiconductor wafer W and a remaining process gas of the reaction chamber 10a to the outside of the reaction chamber 10a is arranged at the bottom portion of the reaction chamber 10a. The gas exhaust portion 126 is connected to the sub gas exhaust passage 15a (FIG. 1).

In addition, in the reaction chamber 10a illustrated in FIG. 2, a wafer doorway (not shown) and a gate valve (not shown) for loading and unloading the semiconductor wafer W are arranged in a site of a wall of the reaction chamber 10a. The semiconductor wafer W can be transferred, for example, between a load lock chamber (not shown) connected to the gate valve and the reaction chamber 10a by a handling arm. Herein, the handling arm of which distal hand portion is made of a synthetic quartz can be inserted into a space between the shower plate 101 and the wafer support unit 112.

The vapor phase growth method according to this embodiment uses the epitaxial growth apparatus illustrated in FIGS. 1 and 2. Hereinafter, with respect to the vapor phase growth method according to this embodiment, the case of epitaxial growth of GaN will be described as an example.

In the vapor phase growth method according to this embodiment, the vapor phase growth conditions of the four reaction chambers 10a to 10d are simultaneously controlled by the control unit 19 so as to be substantially the same condition.

First, the semiconductor wafer W as an example of the substrate is loaded in each of the four reaction chambers 10a to 10d.

In a case where, for example, a GaN film is formed on the semiconductor wafer W, TMG (first process gas) using a hydrogen gas as a carrier gas is supplied from the first main gas supply passage 11. In addition, for example, ammonia (second process gas) is supplied from the second main gas supply passage 21. In addition, for example, a hydrogen gas (third process gas) as a separation gas is supplied from the third main gas supply passage 31.

The first process gas of which flow rate is controlled by the first main mass flow controller 12 flows in the first main gas supply passage 11. Next, the first process gas is divided to flow in the four sub gas supply passages 13a, 13b, 13c, and 13d which are branches of the first main gas supply passage 11.

The flow rates of the first process gases divided into the three first sub gas supply passages 13a, 13b, and 13c are controlled by the first sub mass flow controllers 14a, 14b, and 14c, respectively. For example, the flow rates of the first sub mass flow controllers 14a, 14b, and 14c are specified to be ¼ times the total flow rate of the first process gas which is specified by the first main mass flow controller 12.

In addition, the opening degree of the sub mass flow controller 14d is controlled sc that the pressure of the first main gas supply passage 11 monitored by the pressure gauge 41 becomes zero. As a result, the flow rate of the remainder of the first process gas which does not flow in the three first sub gas supply passages 13a, 13b, and 13c, that is, the flow rate corresponding to ¼ times the total flow rate of the first process gas flows in the remaining one second sub gas supply passage 13d. The first process gases which are divided from the first main gas supply passage 11 into the four sub gas supply passages 13a, 13b, 13c, and 13d are supplied to the four reaction chambers 10a to 10d, respectively.

The second process gas of which flow rate is controlled by the second main mass flow controller 22 flows in the second main gas supply passage 21. Next, the second process gas is divided to flow in the four sub gas supply passages 23a, 23b, 23c, and 23d which are branches of the second main gas supply passage 21.

The flow rates of the second process gases divided into the three first sub gas supply passages 23a, 23b, and 23c are controlled by the first sub mass flow controllers 24a, 24b, and 24c, respectively. For example, the flow rates of the first sub mass flow controllers 24a, 24b, and 24c are specified to be ¼ times the total flow rate of the second process gas which is specified by the second main mass flow controller 22.

In addition, the opening degree of the second sub mass flow controller 24d is controlled so that the pressure of the second main gas supply passage 21 monitored by the pressure gauge 51 becomes zero. As a result, the flow rate of the remainder of the second process gas which does not flow in the three first sub gas supply passages 23a, 23b, and 23c, that is, the flow rate corresponding to ¼ times the total flow rate of the second process gas flows in the remaining one second sub gas supply passage 23d. The second process gases which are divided from the second main gas supply passage 21 into the four sub gas supply passages 23a, 23b, 23c, and 23d are supplied to the four reaction chambers 10a to 10d, respectively.

The third process gas of which flow rate is controlled by the third main mass flow controller 32 flows in the third main gas supply passage 31. Next, the third process gas is divided to flow in the four sub gas supply passages 33a, 33b, 33c, and 33d which are branches of the third main gas supply passage 31.

The flow rates of the third process gases divided into the three first sub gas supply passages 33a, 33b, and 33c are controlled by the first sub mass flow controllers 34a, 34b, and 34c, respectively. For example, the flow rates of the first sub mass flow controllers 34a, 34b, and 34c are specified to be ¼ times the total flow rate of the third process gas which is specified by the third main mass flow controller 32.

In addition, the opening degree of the second sub mass flow controller 34d is controlled so that the pressure of the third main gas supply passage 31 monitored by the pressure gauge 61 becomes zero. As a result, the flow rate of the remainder of the third process gas which does not flow in the three first sub gas supply passages 33a, 33b, and 33c, that is, the flow rate corresponding to ¼ times the total flow rate of the third process gas flows in the remaining one second sub gas supply passage 33d. The third process gases which are divided from the third main gas supply passage 31 into the four sub gas supply passages 33a, 33b, 33c, and 33d are supplied to the four reaction chambers 10a to 10d, respectively.

The internal pressures of the reaction chambers 10a to 10d are controlled by the pressure adjusting units 18a to 18d so as to be substantially the same pressure.

In this manner, the first, second, and third process gases are supplied to each of the reaction chambers 10a to 10d, so that the GaN film is formed on the semiconductor wafer W.

The vapor phase growth conditions of the four reaction chambers 10a, 10b, 10c, and 10d are controlled by the control unit 19 so as to be substantially the same condition, that is, substantially the same process recipe. For example, the control unit 19 controls the first, second, and third main mass flow controllers 12, 22, and 32 with substantially the same process recipe. In addition, the control unit controls the first sub mass flow controllers 14a, 24a, and 34a with substantially the same process recipe. In addition, the control unit controls the first sub mass flow controllers 14b, 24b, and 34b with substantially the same process recipe. In addition, the control unit controls the first sub mass flow controllers 14c, 24c, and 34c with substantially the same process recipe. In addition, the control unit controls the pressure adjusting units 18a, 18b, 18c, and 18d with substantially the same process recipe. In addition, the control unit controls temperatures, rotational speeds of substrates, and the like of the reaction chambers 10a, 10b, 10c, and 10d with substantially the same process recipe.

Hereinafter, specific processes in the reaction chambers will be described while exemplifying the reaction chamber 10a.

For example, the hydrogen gases are supplied from the three first sub gas supply passages 13a, 23a, and 33a to the reaction chamber 10a, and the vacuum pump 17 operates to exhaust the gas in the reaction chamber 10a from the gas exhaust portion 126. In the state where the reaction chamber 10a is controlled at a predetermined pressure, the semiconductor wafer W is mounted on the support unit 112 in the reaction chamber 10a.

In the loading of the semiconductor wafer W, for example, a gate valve (not shown) of a wafer doorway of the reaction chamber 10a is opened, and by the handling arm, the semiconductor wafer W in the load lock chamber is loaded in the reaction chamber 10a. The semiconductor wafer W is mounted on the support unit 112 by using, for example, a push up pin (not shown). The handling arm is returned to the load lock chamber, and the gate valve is closed.

Herein, the semiconductor wafer W mounted on the support unit 112 is preliminarily heated up to a predetermined temperature by the heating unit 116. Next, by increasing the heating power of the heating unit 116, the temperature of the semiconductor wafer W is increased up to a predetermined temperature, for example, a film formation temperature of about 1100° C. The semiconductor wafer W rotates at a predetermined rotational speed.

The TMG (first process gas) using the hydrogen gas as a carrier gas is supplied from the first sub gas supply passage 13a through the shower plate 101 to the reaction chamber 10a. In addition, the ammonia (second process gas) is supplied from the first sub gas supply passage 23a through the shower plate 101 to the reaction chamber 10a. In addition, the hydrogen gas (third process gas) as a separation gas is supplied from the first sub gas supply passage 33a through the shower plate 101 to the reaction chamber 10a. As a result, the GaN film is grown on the semiconductor wafer W in an epitaxial growth manner.

When the epitaxial growth is completed, the inflow of the group III source gas into the first sub gas supply passage 13a is stopped. As a result, the growth of the single crystal film of GaN is completed. By decreasing the heating power of the heating unit 116, the temperature of the semiconductor wafer W is decreased down to a predetermined temperature. After the temperature of the semiconductor wafer W is decreased down to the predetermined temperature, the supplying of ammonia from the first sub gas supply passage 23a to the reaction chamber 10a is stopped.

When the film formation is completed, the hydrogen gas is supplied through the first sub gas supply passage 13a to the reaction chamber 10a. In addition, the hydrogen gas is supplied through the first sub gas supply passage 23a to the reaction chamber 10a.

Herein, for example, in the state where the rotation of the rotating body unit 114 is stopped and the semiconductor wafer W on which a single crystal film is formed is mounted on the support unit 112, the heating power of the heating unit 116 is controlled so that the temperature of the semiconductor wafer W is decreased down to a transferring temperature.

Next, the semiconductor wafer W is detached from the support unit 112 by, for example, a push up pin. Next, the gate valve is opened again, the handling arm is inserted between the shower plate 101 and the support unit 112, and the semiconductor wafer W is placed on the handling arm. Next, the handling arm on which the semiconductor wafer W is placed is returned to the load lock chamber.

In this manner, one time of the film formation on the semiconductor wafer W is completed. For example, subsequently, the film formation on the other semiconductor wafers W may be performed according to the substantially the same process sequence as the above-described process sequence. With respect to the reaction chambers 10b, 10c, and 10d, the film formation on the semiconductor wafers W is performed at the same time in the same condition as the reaction chamber 10a. For example, the temperatures of the semiconductor wafers W (substrates), the flow rates of the process gases, the rotational speeds of the semiconductor wafers W (substrates), and the internal pressures of the reaction chambers 10a, 10b, 10c, and 10d are controlled to be substantially the same. In this example, each of the temperatures, the flow rates, the rotational speeds and the internal pressures are controlled to be within deviations of 5%.

According to the vapor phase growth apparatus according to this embodiment, when the gas supplied from one main gas supply passage is divided into the n sub gas supply passages to be distributed to then (n is an integer of 2 or more) reaction chambers, the flow rates of the (n−1) first sub gas supply passages are controlled by the first sub mass flow controllers so as to be 1/n times the total flow rate of the process gas, so that the flow rate of the remainder of the total flow rate flows in the remaining one second sub gas supply passage.

It is considered that all the n sub gas supply passages are provided with flow rate control type sub mass flow controllers so that 1/n times the total flow rate of the process gas flows in each of the n sub gas supply passages. In this case, due to a variation in characteristic of the sub mass flow controllers, a total of the flow rates of the process gases flowing from the sub mass flow controllers into the sides of the reaction chambers may be smaller than the total flow rate of the process gas supplied from the main gas supply passage. In this case, an excessive pressure (gas pressure) is exerted on the passages between the main mass flow controller and the sub mass flow controllers, so that problems such as gas leakage may occur in pipes, valves, or the like constituting the passages.

On the contrary, due to a variation in characteristic of the sub mass flow controllers, a total of the flow rates of the process gases which the sub mass flow controllers is to flow into the sides of the reaction chambers may be larger than the total flow rate of the process gas supplied from the main gas supply passage. In this case, the operation of the sub mass flow controller which cannot flow the specified flow rate may be unstable.

According to the vapor phase growth apparatus according to this embodiment, among the n sub gas supply passages, the flow rates of the (n−1) first sub gas supply passages are controlled by flow rate control type first sub mass flow controllers so as to be 1/n times the total flow rate of the process gas, so that the flow rate of the remainder of the total flow rate flows in the remaining one second sub gas supply passage. More specifically, the amount of the process gas flowing in the remaining one sub gas supply passage is controlled by the opening degree control type mass flow controller so that the value of the pressure gauge arranged before the branching point of the main gas supply passage into the sub gas supply passage becomes zero. As a result, a total of the flow rates of the process gases flowing from the sub mass flow controllers into the sides of the reaction chambers becomes substantially the same as the total flow rate of the process gas supplied from the main gas supply passage.

Therefore, the problem in that the pressures of the passages between the main mass flow controller and the sub mass flow controllers excessively increase and the problem in that the sub mass flow controller cannot flow a specified flow rate do not occur. Accordingly, a highly reliable vapor phase growth apparatus having a plurality of reaction chambers is achieved.

In addition, the vapor phase growth conditions of the n reaction chambers can be controlled simultaneously by using a single control unit in substantially the same condition, that is, substantially the same process recipe. As a result, film formation can be simultaneously performed on a large number of substrates by using a simple configuration. In addition, since the control system has a simple configuration, a highly reliable vapor phase growth apparatus is achieved.

In addition, according to the vapor phase growth method according to this embodiment, the problem in that the pressures of the passages between the main mass flow controller and the sub mass flow controllers abnormally increase or the problem in that the sub mass flow controller cannot flow a specified flow rate does not occur. Accordingly, a stable, highly reliable vapor phase growth method is achieved.

Second Embodiment

A vapor phase growth apparatus according to this embodiment is the same as that of the first embodiment except that the vapor phase growth apparatus further includes a mass flow meter which is arranged in the above-described one second sub gas supply passage to measure the flow rate of the process gas flowing in the one second sub gas supply passage. Therefore, the redundant description of the first embodiment will be omitted.

Figure 3:
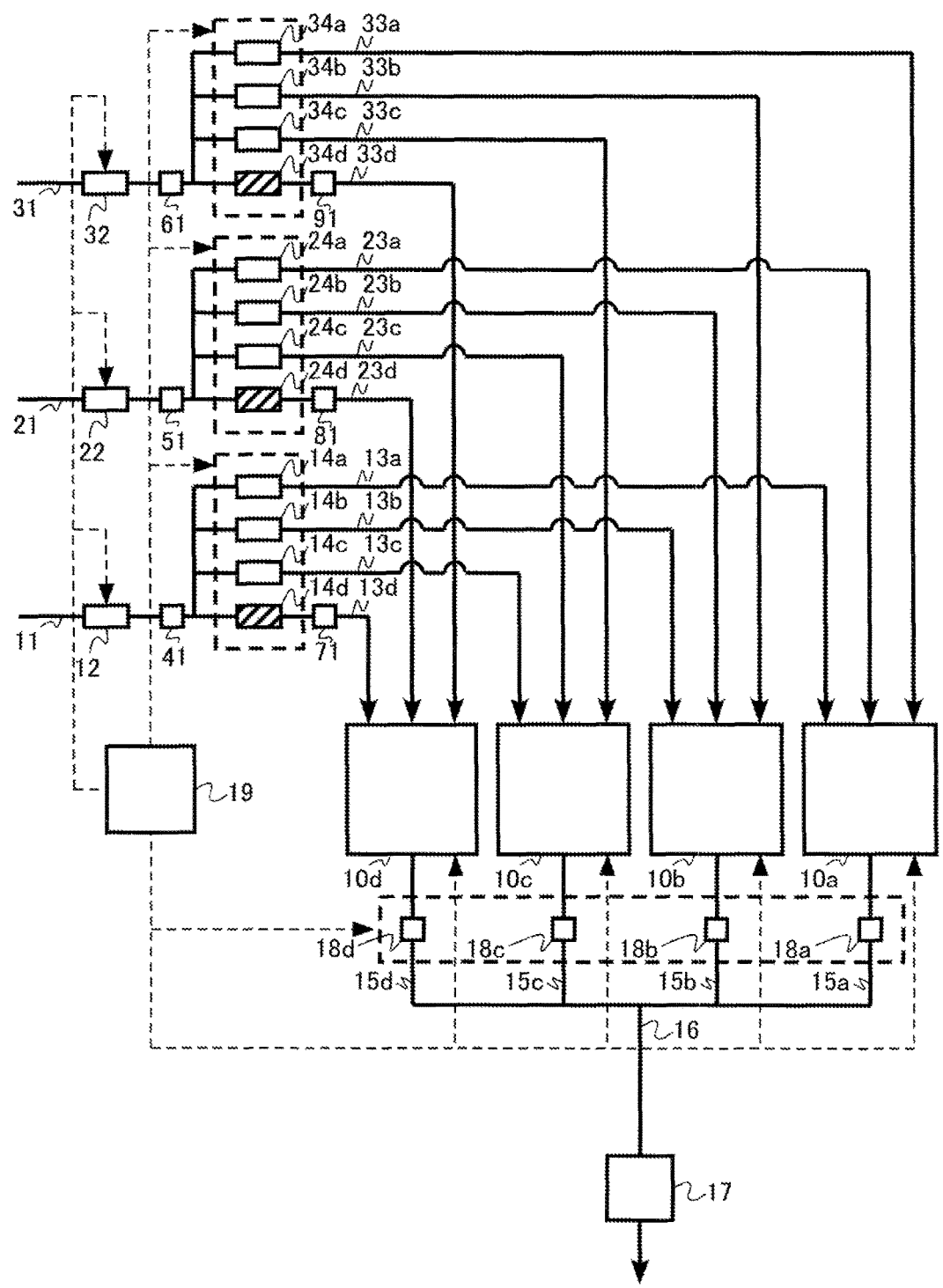
FIG. 3 is a configuration view illustrating a vapor phase growth apparatus according to a second embodiment.

FIG. 3 is a configuration view illustrating the vapor phase growth apparatus according to this embodiment.

Among the four sub gas supply passages 13a to 13d which are branches of the first main gas supply passage 11, the one sub gas supply passage where the opening degree control type second mass flow controller 14d is arranged, that is, the second sub gas supply passage 13d is provided with a mass flow meter 71. The mass flow meter 71 measures the flow rate of the first process gas flowing in the second sub gas supply passage 13d.

Similarly, among the four sub gas supply passages 23a to 23d which are branches of the second main gas supply passage 21, the one sub gas supply passage where the opening degree control type mass flow controller 24d is arranged, that is, the second sub gas supply passage 23d is provided with a mass flow meter 81. The mass flow meter 81 measures the flow rate of the second process gas flowing in the second sub gas supply passage 23d.

Similarly, among the four sub gas supply passages 33a to 33d which are branches of the third main gas supply passage 31, the one sub gas supply passage where the opening degree control type mass flow controller 34d is arranged, that is, the second sub gas supply passage 33d is provided with a mass flow meter 91. The mass flow meter 91 measures the flow rate of the third process gas flowing in the second sub gas supply passage 33d.

According to the vapor phase growth apparatus according to this embodiment, the flow rate of the process gas flowing in the one sub gas supply passage where a flow rate control, type mass flow controller is not arranged and the flow rate is not controlled as a pre-defined flow rate is measured by the mass flow meter. As a result, the flow rate of the process gas supplied from the sub gas supply passage to the reaction chamber can be monitored. Therefore, for example, an abnormal state where the flow rate of the process gas supplied from the sub gas supply passage to the reaction chamber deviates from an allowable flow rate range can be detected.

In addition, a process stopping unit may be further included to stop a process such as the supplying of the process gas in a case where the flow rates of the process gases measured by the mass flow meters 71, 81, and 91 deviate from the allowable ranges. The process stopping unit may be incorporated into, for example, the control unit 19.

Third Embodiment

A vapor phase growth apparatus according to this embodiment is the same as that of the first embodiment except that the vapor phase growth apparatus further includes a pressure adjusting unit which is arranged in the main gas exhaust passage between the reaction chambers and the pump to simultaneously control the internal pressures of the n reaction chambers. Therefore, the redundant description of the first embodiment will be omitted.

Figure 4:
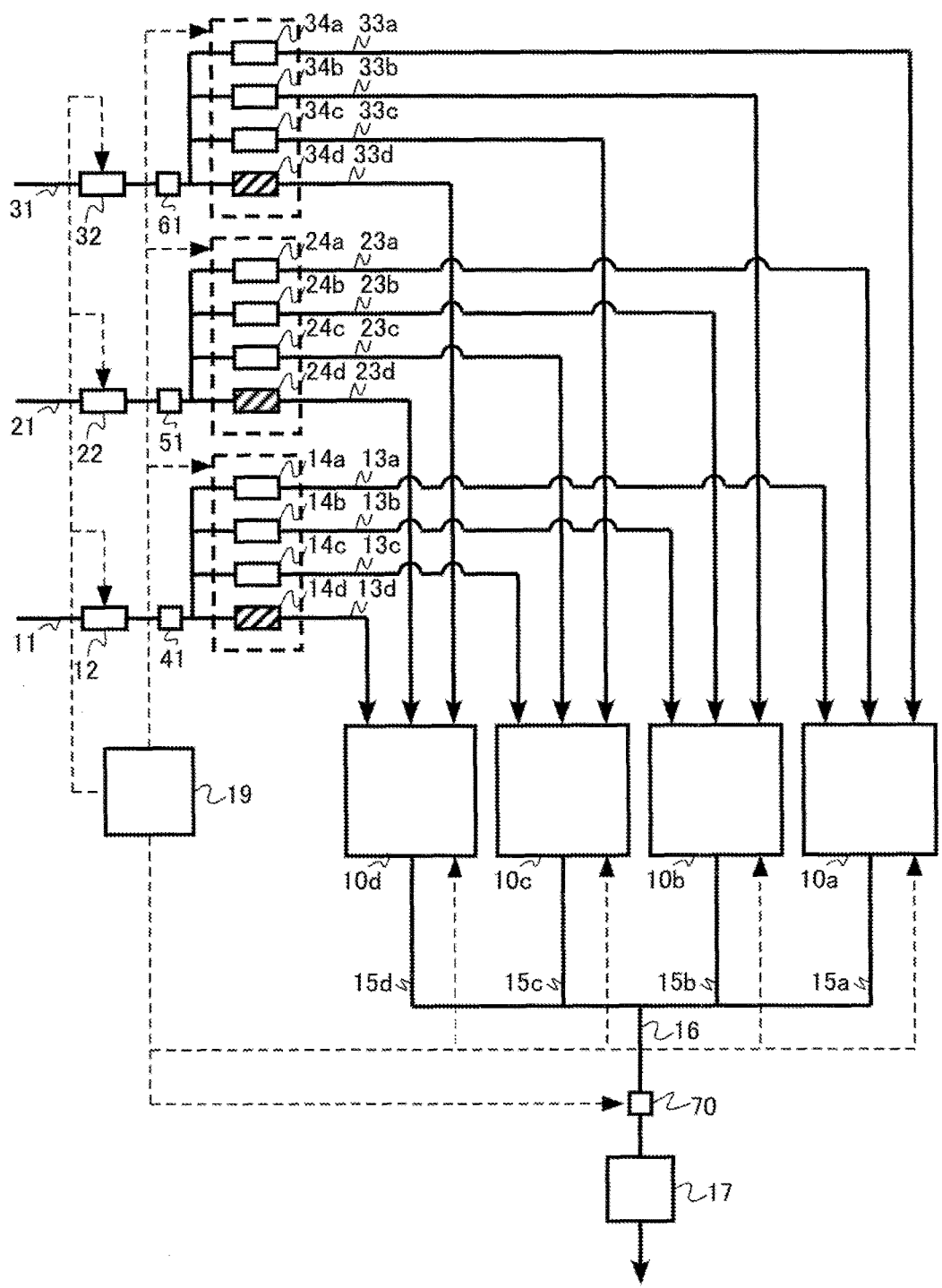
FIG. 4 is a configuration view illustrating a vapor phase growth apparatus according to a third embodiment.

FIG. 4 is a configuration view illustrating the vapor phase growth apparatus according to this embodiment.

One pressure adjusting unit 70 is arranged in the main gas exhaust passage 16 between the reaction chambers 10*a* to 10*d* and the vacuum pump 17. The pressure adjusting unit 70 simultaneously controls the internal pressures of the four reaction chambers 10*a* to 10*d*. The pressure adjusting unit 70 is, for example, a throttle valve.

According to the vapor phase growth apparatus according to this embodiment, the internal pressures of the n reaction chambers are controlled by a single pressure adjusting unit. Therefore, all the internal pressures of the n reaction chambers are easily controlled to be substantially the same pressure. In addition, in comparison with the configuration where the respective pressure adjusting units are arranged for the n reaction chambers, a simple configuration is achieved.

Heretofore, the embodiments of the invention are described with reference to specific examples. The above-described embodiments are provided as examples, and thus, the invention is not limited thereto. In addition, components of the embodiments may be appropriately combined.

For example, a configuration other than the configurations of the embodiments may be employed if, in the configuration, the remainder of the process gas which does not flow in the (n−1) first sub gas supply passages is supplied from the one second sub gas supply passage to the one reaction chamber other than the (n−1) reaction chambers.

For example, in the embodiments, a case where the single crystal film of GaN (gallium nitride) is formed is described as an example. However, the invention may be applied to a case where a single crystal film of other group III-V nitride-based semiconductors, such as AlN (aluminum nitride), AlGaN (aluminum gallium nitride), or InGaN (indium gallium nitride), is formed. In addition, the invention may be applied to a group III-V semiconductor such as GaAs.

In addition, although one type of TMG used as the organic metal is described as an example, two or more types of organic metals may be used as a source of the group III element. In addition, the organic metal may be an element other than the group III element.

In addition, although the hydrogen gas ($H_2$) is described as an example of the carrier gas, other gases including nitrogen gas ($N_2$), argon gas (Ar), helium gas (He), or a combination of these gases may be used as the carrier gas.

In addition, the process gas may be a mixed gas containing, for example, both of a group III element and a group V element.

In addition, in the embodiments, although a case where each of the n reaction chambers is a vertical single-wafer type epitaxial growth apparatus which performs film formation on every wafer is described as an example, the n reaction chambers are not limited to the single-wafer type epitaxial growth apparatus. For example, the invention may be applied to the case of a planetary type CVD) apparatus or a horizontal type epitaxial growth apparatus which simultaneously performs film formation on a plurality of wafers self-revolving.

In the embodiments, although the apparatus components, the manufacturing methods, and the like that are not directly needed to describe the invention are omitted in the description, the apparatus components, the manufacturing methods, and the like that are to be needed may be appropriately selected to be used. All of the vapor phase growth apparatuses and the vapor phase growth methods that include the elements of the invention and can be appropriately modified in design by the ordinarily skilled in the art are included within the scope of the invention. The scope of the invention is defined by the claims and the equivalents thereof.

What is claimed is:

1. A vapor phase growth apparatus comprising:
   n (n is an integer of 2 or more) reaction chambers; and
   a plurality of main gas supply passages, each of the main gas supply passages supplying a process gas to the n reaction chambers, each of the main gas supply passages including
   a main mass flow controller arranged in the main gas supply passage, the main mass flow controller controlling a flow rate of the process gas flowing in the main gas supply passage,
   (n−1) first sub gas supply passages being branches of the main gas supply passage, the first sub gas supply passages supplying divided process gases to (n−1) reaction chambers among the n reaction chambers respectively,
   (n−1) first sub mass flow controllers arranged in the first sub gas supply passages respectively, the first sub mass flow controllers controlling flow rates of the divided process gases respectively, in such a manner that the flow rate of the divided process gases are 1/n times the total flow rate of the process gas,
   one second sub gas supply passage being a branch of the main gas supply passage, the second sub gas supply passage supplying a remainder of the process gas that is not flowing in the first sub gas supply passages, to one reaction chamber other than the (n−1) reaction chambers, in such a manner that the flow rate of the remainder of the process gas in the one second sub gas supply passage is not controlled as a pre-defined flow rate,
   a pressure gauge arranged in the main gas supply passage between the main mass flow controller and the n reaction chambers, and
   a second sub mass flow controller arranged in the second sub gas supply passage, the second sub mass flow controller being controlled based on a measurement result of the pressure gauge,
   wherein the process gas flows from upstream to downstream, the (n−1) first sub mass flow controllers and the second sub mass flow controller are located upstream of the reaction chambers and downstream of the pressure gauge.

2. The vapor phase growth apparatus according to claim 1, further comprising:
   a mass flow meter arranged in the second sub gas supply passage to measure the flow rate of the process gas flowing in the second sub gas supply passage.

3. The vapor phase growth apparatus according to claim 1, further comprising;

n sub gas exhaust passages exhausting the process gases from the n reaction chambers;

a main gas exhaust passage being a confluence of the n sub gas exhaust passages; and a pump arranged in the main gas exhaust passage.

4. The vapor phase growth apparatus according to claim 3, further comprising:

a pressure adjusting unit arranged in the main gas exhaust passage between the reaction chambers and the pump, the pressure adjusting unit simultaneously controlling internal pressures of the n reaction chambers.

5. The vapor phase growth apparatus according to claim 1, further comprising:

a control unit controlling the main mass flow controller and the first sub mass flow controllers.

6. The vapor phase growth apparatus according to claim 4, wherein the pressure adjusting unit includes a throttle valve.

7. The vapor phase growth apparatus according to claim 5, wherein the control unit includes a control circuit.

8. A vapor phase growth method by using the vapor phase growth apparatus of claim 1, the method comprising:

loading n substrates into the n reaction chambers of the vapor phase growth apparatus respectively;

allowing a process gas to flow through at least one of the main gas supply passages having a flow rate controlled by the corresponding main mass flow controller;

allowing the process gases to be divided to flow in the (n−1) first sub gas supply passages being branches of the at least one main gas supply passage and having flow rates controlled by the sub mass flow controllers;

allowing a remainder of the process gas that is not flowing in the (n−1) first sub gas supply passages to flow, in the one second sub gas supply passage being a branch of the at least one main gas supply passage; and supplying the process gases from the first sub gas supply passages and the second sub gas supply passage to the respective n reaction chambers to perform film formation on each of the substrates.

9. The vapor phase growth method according to claim 8, wherein the film formation is performed on the substrates in substantially the same condition in the n reaction chambers respectively.

10. The vapor phase growth method according to claim 8, wherein the process gas is a gas containing a group III element.

11. The vapor phase growth method according to claim 9, wherein the condition includes substrate temperature, substrate rotational speed, process gas flow rate, and chamber pressure.

12. The vapor phase growth apparatus according to claim 1, wherein each of the first sub mass flow controllers is a flow rate control type mass flow controller, and the second sub mass flow controller is an opening degree control type mass flow controller, an opening degree of the second sub mass flow controller being controlled based on the measurement result of the pressure gauge.

13. The vapor phase growth apparatus according to claim 1, wherein a flow rate control type mass flow controller is not arranged in the second sub gas supply passage.

14. The vapor phase growth apparatus according to claim 1, wherein each of the first sub mass flow controllers is a flow rate control type mass flow controller, the second sub mass flow controller is an opening degree control type mass flow controller, an opening degree of the second sub mass flow controller being controlled based on the measurement result of the pressure gauge, and the flow rate control type mass flow controller is not arranged in the second sub gas supply passage.

* * * * *